United States Patent
Yamamoto et al.

(10) Patent No.: US 10,284,052 B2
(45) Date of Patent: May 7, 2019

(54) MOTOR DRIVE DEVICE WHICH COOLS HEAT SINK BY OUTSIDE AIR

(71) Applicant: FANUC CORPORATION, Yamanashi (JP)

(72) Inventors: Kazuhiro Yamamoto, Yamanashi (JP); Makoto Takeshita, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 152 days.

(21) Appl. No.: 15/386,504

(22) Filed: Dec. 21, 2016

(65) Prior Publication Data

US 2017/0187263 A1    Jun. 29, 2017

(30) Foreign Application Priority Data

Dec. 25, 2015 (JP) ................................. 2015-254809

(51) Int. Cl.
| | |
|---|---|
| *H02K 9/04* | (2006.01) |
| *H02K 11/33* | (2016.01) |
| *H02K 5/18* | (2006.01) |
| *H02K 5/20* | (2006.01) |
| *H05K 7/20* | (2006.01) |

(52) U.S. Cl.
CPC ................. *H02K 9/04* (2013.01); *H02K 5/18* (2013.01); *H02K 5/20* (2013.01); *H02K 11/33* (2016.01); *H05K 7/20918* (2013.01)

(58) Field of Classification Search
CPC . H02K 9/04; H02K 11/33; H02K 5/18; H02K 5/20
See application file for complete search history.

(56) References Cited

U.S. PATENT DOCUMENTS

| | | | | |
|---|---|---|---|---|
| 5,760,333 A | * | 6/1998 | Kitahara | ............... H01L 23/427 165/80.3 |
| 6,678,157 B1 | * | 1/2004 | Bestwick | .................. G06F 1/20 165/104.34 |
| 2005/0041392 A1 | * | 2/2005 | Chen | .................. H05K 7/20727 361/695 |
| 2006/0002081 A1 | * | 1/2006 | Hongo | .................... G06F 1/203 361/691 |

(Continued)

FOREIGN PATENT DOCUMENTS

| | | |
|---|---|---|
| DE | 102008027757 A1 | 11/2009 |
| DE | 102014017161 A1 | 5/2015 |
| JP | 1100732 A | 4/1995 |

(Continued)

OTHER PUBLICATIONS

Untranslated Decision to Grant a Patent mailed by Japan Patent Office (JPO) for Application No. JP 2015-254809 dated Feb. 6, 2018, 3 pages.

(Continued)

*Primary Examiner* — Emily P Pham
(74) *Attorney, Agent, or Firm* — Fredrikson & Byron, P.A.

(57) ABSTRACT

A motor drive device is fixed to a wall part of a housing and comprises a duct having an inflow port and an outflow port of air. A main body part of the duct functions as a heat-sink unit which releases heat into the duct. The duct is arranged inside the housing. The inflow port and the outflow port are formed so that outside air can flow through openings formed in the wall part.

6 Claims, 16 Drawing Sheets

(56) References Cited

U.S. PATENT DOCUMENTS

2007/0247811 A1\* 10/2007 Ohmi ................. H05K 7/20909
                                                                361/697
2016/0336893 A1\* 11/2016 Felix ....................... F04B 49/20

FOREIGN PATENT DOCUMENTS

| JP | 2508697 Y2 | 6/1996 |
| JP | 2580507 Y2 | 6/1998 |
| JP | 2004235258 A | 8/2004 |
| JP | 200927776 A | 2/2009 |
| JP | 2015103750 A | 6/2015 |
| JP | 2015153925 A | 8/2015 |

OTHER PUBLICATIONS

English machine translation of Decision to Grant a Patent mailed by Japan Patent Office (JPO) for Application No. JP 2015-254809 dated Feb. 6, 2018, 3 pages.
Untranslated Notification of Reasons for Refusal mailed by Japan Patent Office (JPO) for Application No. JP 2015-254809, dated Dec. 12, 2017, 3 pages.
Translated Notification of Reasons for Refusal mailed by Japan Patent Office (JPO) for Application No. JP 2015-254809, dated Dec. 12, 2017, 3 pages.
English Abstract and Machine Translation for Japanese Publication No. 2015-103750 A, published Jun. 4, 2015, 7 pgs.
English Abstract and Machine Translation for Japanese Publication No. 2009-027776 A, published Feb. 5, 2009, 8 pgs.
English Abstract and Machine Translation for Japanese Publication No. 2015-153925 A, published Aug. 24, 2015, 12 pgs.
English Abstract and Machine Translation for Japanese Publication No. 2004-235258 A, published Aug. 19, 2004, 24 pgs.
English Machine Translation for Japanese Publication No. 2580507 Y, published Jun. 26, 1998, 8 pgs.
English Machine Translation for Japanese Publication No. 2508697 Y, published Jun. 11, 1996, 5 pgs.
English Abstract and Machine Translation for Japanese Publication No. 07-100732 A, published Apr. 18, 1995, 36 pgs.
English Abstract and Machine Translation for German Publication No. DE102014017161 A1, published May 28, 2015, 9 pgs.
English Abstract and Machine Translation for German Publication No. DE102008027757 A1, published Nov. 5, 2009, 6 pgs.

\* cited by examiner

MOTOR DRIVE DEVICE WHICH COOLS HEAT SINK BY OUTSIDE AIR

BACKGROUND OF THE INVENTION

1. Field of the Invention

The present invention relates to a motor drive device.

2. Description of the Related Art

In a device including a motor which drives a predetermined part, such as a robot or a machine tool, a motor drive device for driving the motor is arranged. The motor drive device includes electronic components, such as semiconductor elements and capacitors for controlling a current to be supplied to the motor. The motor drive device is arranged on, for example, a power panel including an electromagnetic switch, a battery, and the like. The electronic components which are arranged in the motor drive device need to be cooled due to heat generation.

As a method for cooling the motor drive device, an inside air cooling method in which a heat sink which releases heat of the electronic components is arranged inside the power panel, and the heat sink is cooled by air inside the power panel is general. Alternatively, an outside air cooling method in which a heat sink connected to the electronic components is arranged outside the power panel, and the heat sink is cooled by outside air is known.

For example, Japanese Unexamined Patent Publication No. 2015-103750A discloses the inside air cooling method in which a heat sink of a motor drive device arranged inside a power panel is cooled by air inside the power panel.

Japanese Unexamined Patent Publication No. 2009-27776A discloses a control panel in which an inverter is arranged inside a housing, and a heat sink is arranged outside the housing. In the control panel, the outside air cooling method in which the heat sink arranged outside the housing is cooled by outside air is adopted.

SUMMARY OF THE INVENTION

In the inside air cooling method, all heat generated from a motor drive device is released to air inside a power panel. Thus, the temperature of the air inside the power panel is increased. In order to suppress the increase of the temperature of the air inside the power panel, a heat exchanger or the like for cooling the air inside the power panel may be needed.

Thus, it is preferable that the motor drive device can be cooled by outside air. In the outside air cooling method, while a heat sink is arranged outside a power panel, a printed circuit board on which electronic components are arranged needs to be arranged inside the power panel. As disclosed in Japanese Unexamined Patent Publication No. 2009-27776 described above, the heat sink can be arranged outside through an opening of a housing from the inside of the power panel. However, there is a problem that the sizes of the heat sink and a cooling fan in the width direction are limited by the width of the opening. In particular, there was a problem that a small-sized fan having a small width is preferable to be used as the cooling fan which generates an air flow in the heat sink. Thus, the motor drive device has room for improvement of a cooling capacity.

A motor drive device of the present invention is fixed to a wall part of a housing of a power panel. The motor drive device comprises a duct which has an inflow port and an outflow port of air and configures a flow passage of the air, and a heat-sink unit which releases heat into the duct. The inflow port and the outflow port are formed so that outside air can flow through openings formed in the wall part of the housing. The duct is arranged inside the housing, and the inside and the outside of the duct are isolated.

According to the above-described invention, a heat-generating component which is driven so as to generate heat can be provided, and the heat-generating component can be in contact with the heat-sink unit.

According to the above-described invention, a cooling fan which generates an air flow inside the duct can be provided.

In the above-described invention, the cooling fan can be arranged inside the duct.

In the above-described invention, the heat-sink unit can include a plurality of fins, and the fins can be arranged inside the duct.

In the above-described invention, the heat-sink unit can include the plurality of fins and a plate-like member which supports the fins, and the plate-like member can configure a part of the duct, and can be formed to be detachable from a main body part of the duct.

In the above-described invention, the duct can include the main body part and a plate-like part which can be detached from the main body part, and the plate-like part can be arranged around the cooling fan, and can be formed so that the cooling fan can be taken out from the inside of the duct by being detached from the main body part.

DETAILED DESCRIPTION

A motor drive device according to an embodiment will be described with reference to FIG. 1 to FIG. 16. In the present embodiment, a power panel will be described as an example of a device comprising the motor drive device. The power panel has a function for supplying electricity to a predetermined device such as a robot and a machine tool. The power panel comprises the motor drive device, a relay, a battery, and the like. The motor drive device of the present embodiment is attached to a wall part which isolates the outside and the inside of the power panel in a housing of the power panel. In the motor drive device of the present embodiment, a printed circuit board is arranged inside the power panel and a heat-generating component is cooled by air outside the housing (outside air).

Figure 1:
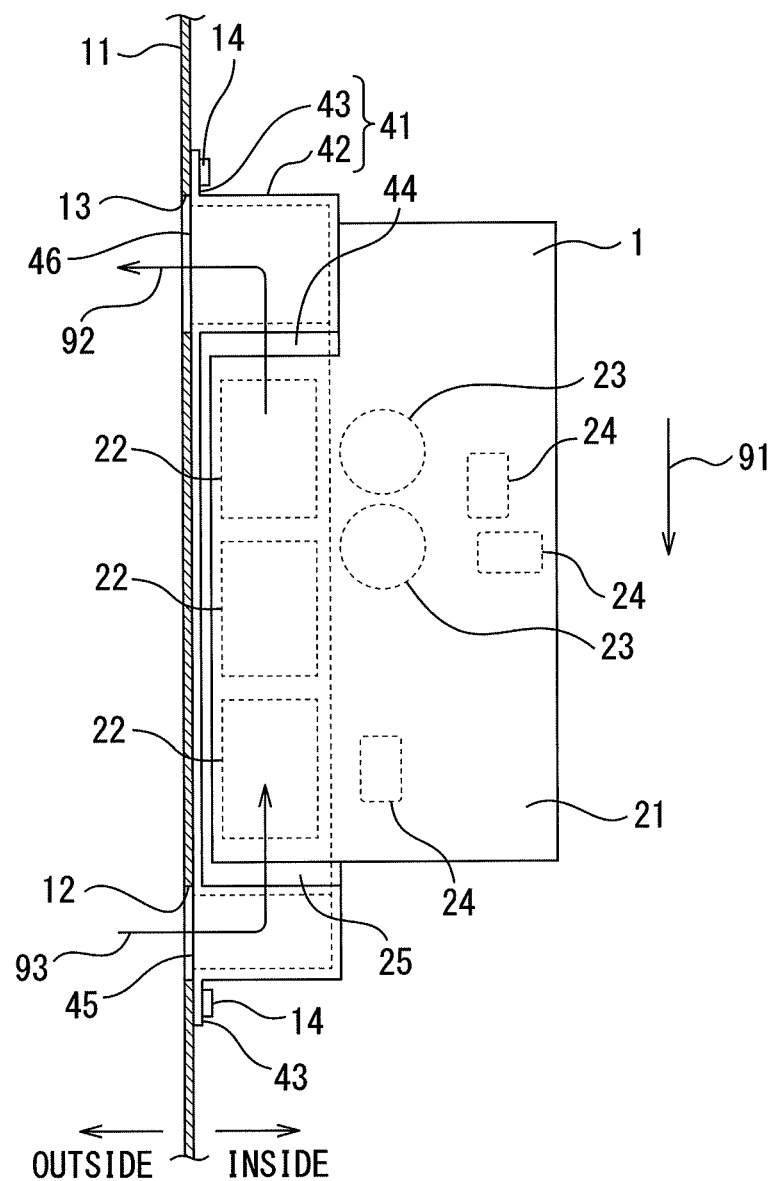
FIG. 1 is a schematic partial cross-sectional view when first motor drive device in an embodiment is attached to a power panel.
Figure 2:
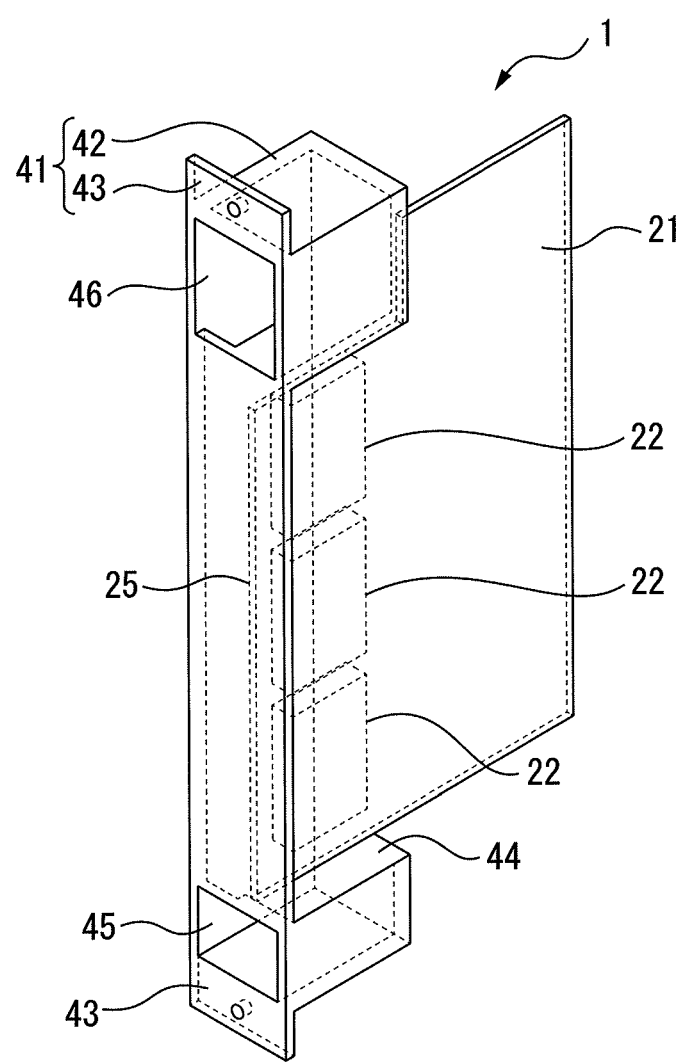
FIG. 2 is a perspective view of the first motor drive device in the embodiment.

FIG. 1 shows a schematic partial cross-sectional view when first motor drive device in the present embodiment is fixed to the wall part of the power panel. FIG. 2 shows a perspective view of the first motor drive device in the present embodiment. With reference to FIG. 1 and FIG. 2, first motor drive device 1 is fixed to a wall part 11 of a housing of a power panel. The first motor drive device 1 comprises a printed circuit board 21 on which electronic components are arranged.

Figure 3:
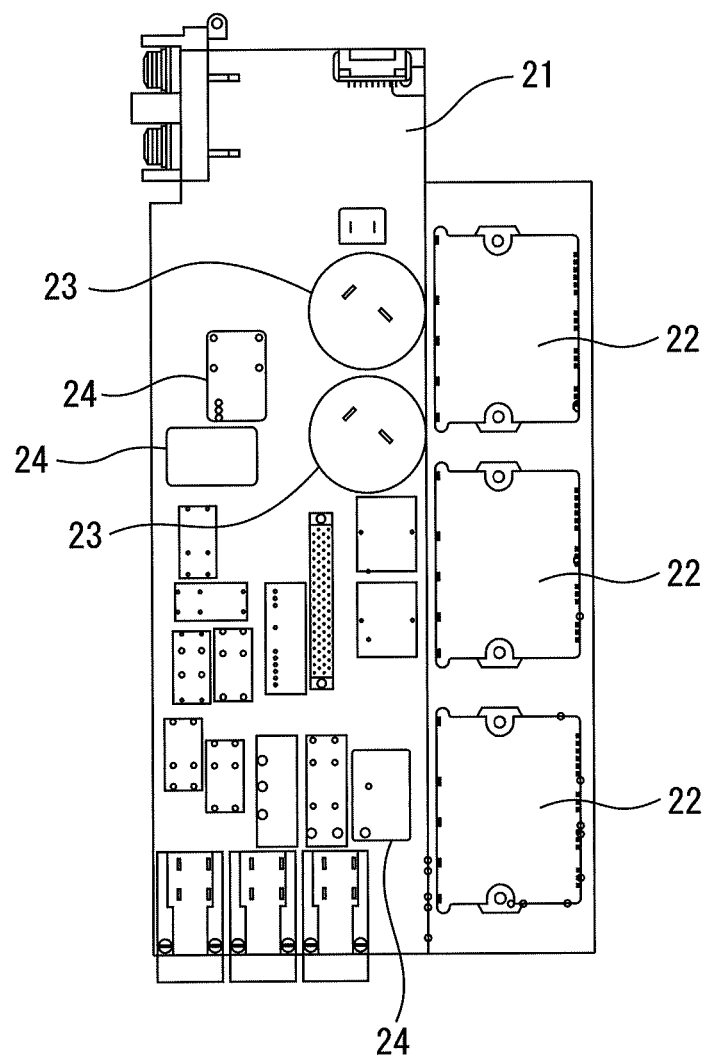
FIG. 3 is a plan view of a printed circuit board in the embodiment.

FIG. 3 shows a plan view of the printed circuit board in the present embodiment. The first motor drive device 1 comprises power elements 22 for generating a current to be supplied to a motor. The power elements 22 of the present embodiment are semiconductor elements, and are fixed to the surface of the printed circuit board 21. Electronic components such as electrolytic capacitors 23 and relays 24 are arranged on the printed circuit board 21 in addition to the power elements 22. In some drawings, the printed circuit board 21 and the power elements 22 may be illustrated with the electrolytic capacitors 23 and the like being omitted.

The power elements 22 arranged on the printed circuit board 21 are driven so as to generate heat. In addition, the electronic components such as the electrolytic capacitors 23 sometimes generate heat. As just described, the motor drive device 1 includes heat-generating components which are driven so as to generate heat.

Figure 4:
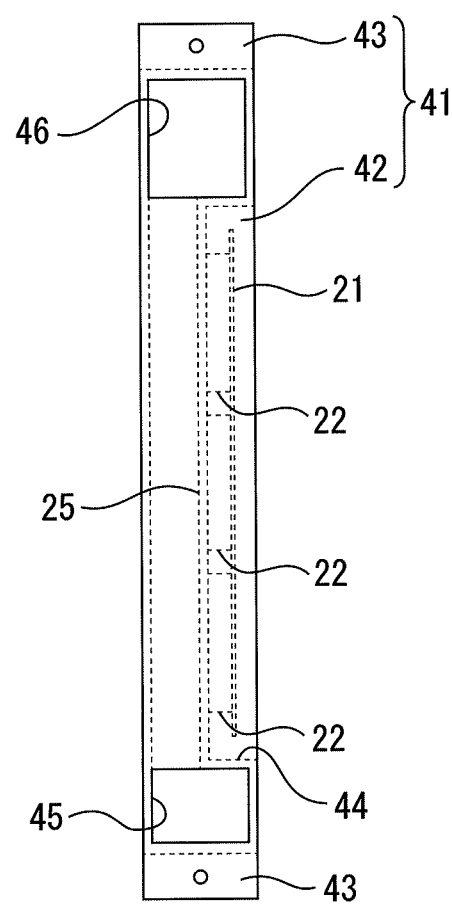
FIG. 4 is a front view of the first motor drive device in the embodiment.
Figure 5:
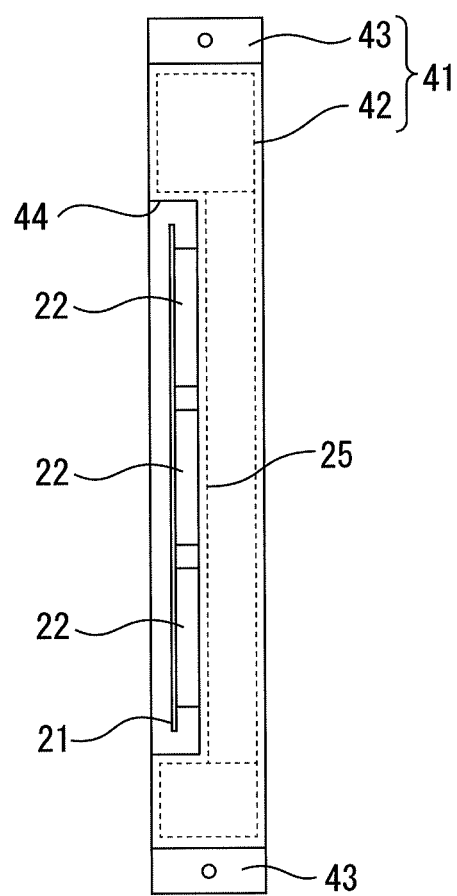
FIG. 5 is a rear view of the first motor drive device in the embodiment.

FIG. 4 shows a front view of the first motor drive device in the present embodiment. FIG. 5 shows a rear view of the first motor drive device in the present embodiment. With reference to FIG. 1, FIG. 2, FIG. 4, and FIG. 5, the motor drive device 1 in the present embodiment comprises a cooling device which cools the heat-generating components. The cooling device comprises a duct 41 which configures a flow passage of air. The duct 41 is arranged inside the housing. The duct 41 has an inflow port 45 into which air flows and an outflow port 46 from which air flows out. The duct 41 includes a main body part 42 which has a tubular shape and a fixing part 43 for fixing the duct 41 to the housing of the power panel. The main body part 42 has a hollow therein. The main body part 42 in the present embodiment has a concave part 44 in the side surface.

Openings 12, 13 are formed in the wall part 11 of the housing of the power panel. The opening 12 is formed to be communicated with the inflow port 45 of the duct 41. In addition, the opening 13 is formed to be communicated with the outflow port 46 of the duct 41. The inflow port 45 and the outflow port 46 are formed so that outside air flows through the openings 12, 13 formed in the wall part 11 of the housing.

The printed circuit board 21 is arranged in the concave part 44 of the main body part 42. The printed circuit board 21 is arranged so that the power elements 22 are in contact with the bottom surface of the concave part 44. In other words, the power elements 22 are in contact with the duct 41. In the first motor drive device 1, the main body part 42 functions as a heat-sink unit 25. The power elements 22 are in contact with the heat-sink unit 25. In the present embodiment, the main body part 42 is formed of metal. Heat can be stored by the main body part 42. In addition, heat can be released from the main body part 42 to air flowing inside the duct 41.

With reference to FIG. 1, the first motor drive device 1 in the present embodiment is arranged inside the housing of the power panel. The fixing part 43 of the duct 41 is fixed to the wall part 11 by use of a screw 14. The openings 12, 13 of the wall part 11 have a size corresponding to that of the inflow port 45 or the outflow port 46. In addition, the inside and the outside of the duct 41 are isolated. As just described, the first motor drive device 1 is formed so that outside air does not flow into the power panel.

A direction indicated by the arrow 91 is the lower side in the vertical direction. In the present embodiment, the duct 41 is arranged so that the main body part 42 extends in the vertical direction. The inflow port 45 of the duct 41 is arranged at the lower side, and the outflow port 46 is arranged at the upper side. Heat of the power elements 22 is transferred to the main body part 42 of the duct 41. Heat of the main body part 42 is transferred to air inside the duct 41. The air inside the main body part 42 whose temperature increases is lowered in density, and thus, climbs and flows out to the outside from the outflow port 46 as indicated by the arrow 92.

As indicated by the arrow 93, newly outside air flows into the inside of the main body part 42 from the inflow port 45. In the first motor drive device, convection generates an air flow inside the duct 41. In the first motor drive device 1, the air flow is naturally generated inside the duct 41, and the heat-sink unit 25 can be cooled. In particular, the power elements 22 in contact with the main body part 42 can be cooled through the main body part 42.

Furthermore, in the first motor drive device 1, the outer surface of the main body part 42 is in contact with air inside the housing of the power panel. Thus, the air inside the power panel can be cooled. Accordingly, other electronic components such as capacitors, which are not in contact with the duct 41 can also be cooled by the air inside the power panel.

The first motor drive device 1 in the present embodiment can incorporate outside air outside the power panel into the duct 41, as indicated by the arrow 93. The heat-generating components are cooled by the outside air, and thus, excellent cooling performance can be achieved. In addition, the air whose temperature has been increased by cooling the heat-generating components is discharged to the outside of the power panel, as indicated by the arrow 92. Thus, it is possible to suppress an increase in the temperature of the air inside the power panel.

In addition, the duct 41 of the present embodiment is formed to isolate the inside and the outside of the main body part 42. The main body part 42 is formed in a sealed manner so that outside air does not flow into the power panel. The configuration allows preventing dust and dirt contained in the air outside the power panel from entering into the power panel.

Figure 6:
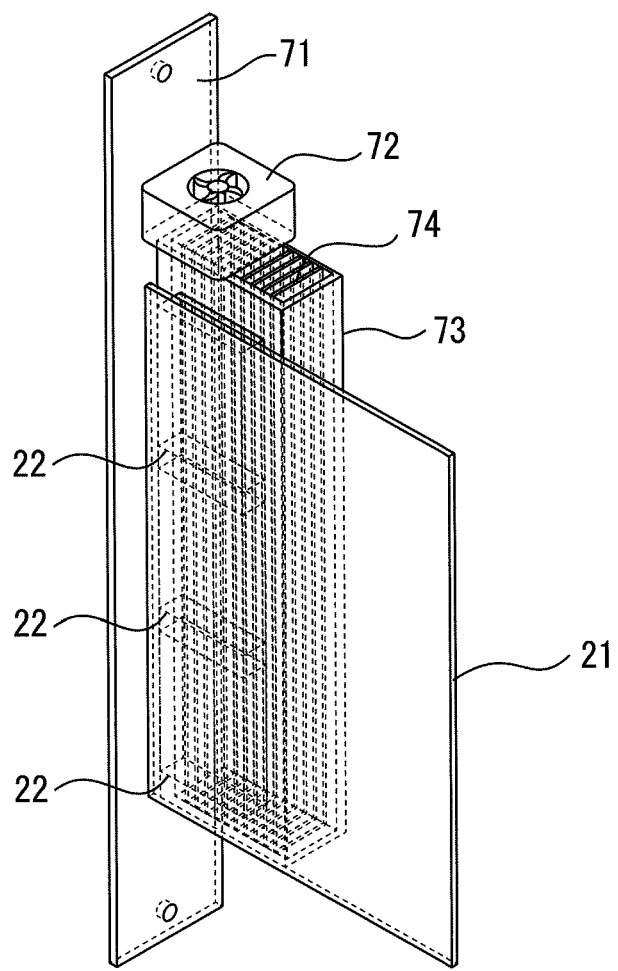
FIG. 6 is a perspective view of a motor drive device of first comparative example.
Figure 7:
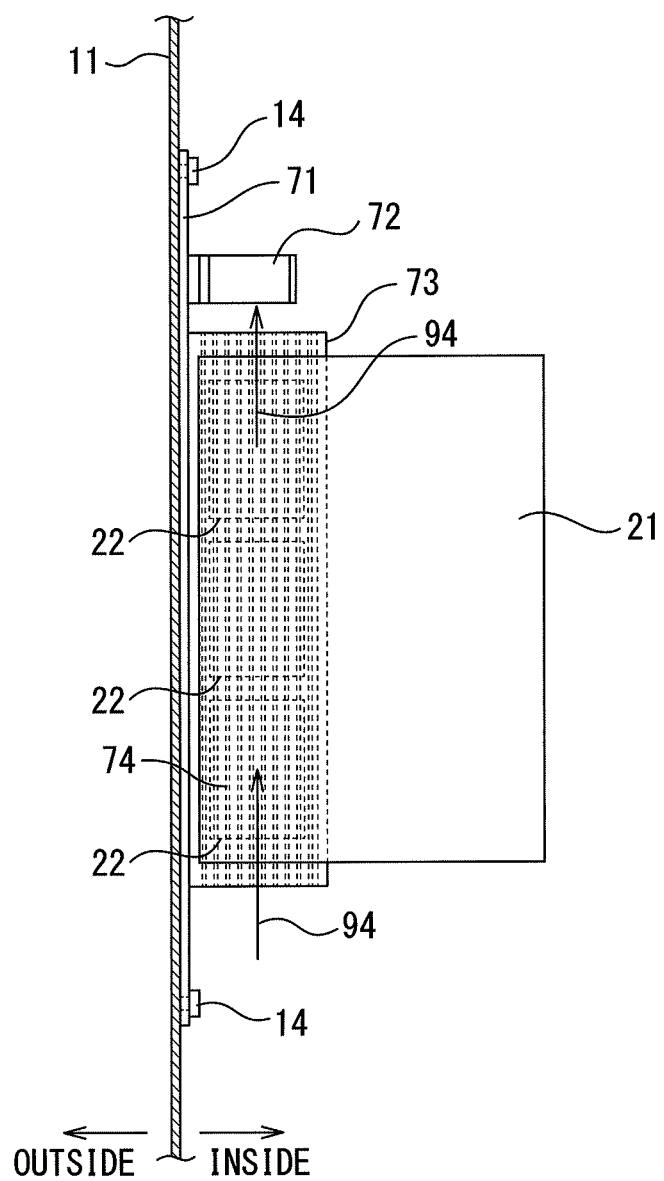
FIG. 7 is a schematic partial cross-sectional view when the motor drive device of the first comparative example is attached to the power panel.

FIG. 6 shows a perspective view of a motor drive device of first comparative example. FIG. 7 shows a schematic partial cross-sectional view when the motor drive device of the first comparative example is attached to the housing of the power panel. With reference to FIG. 6 and FIG. 7, the motor drive device of the first comparative example comprises a plate-like member 71 and a duct 73 fixed to the plate-like member 71. The power elements 22 arranged on the printed circuit board 21 are in contact with the duct 73. In addition, a cooling fan 72 for making air flow inside the duct 73 is arranged.

The plate-like member 71 is fixed to the wall part 11 of the housing by use of the screw 14. Thus, the duct 73, the cooling fan 72, and the printed circuit board 21 are arranged inside the housing of the power panel. In other words, the entire motor drive device is arranged inside the housing. A fin 74 is formed inside the duct 73 of the motor drive device of the first comparative example.

The cooling fan 72 is driven so that an air flow is generated inside the duct 73 as indicated by the arrow 94. Accordingly, the fin 74 is cooled. However, in the motor drive device of the first comparative example, the fin 74 is cooled by drawing in air inside the power panel. The air whose temperature has been increased is released to the inside of the power panel again. The temperature inside the power panel is increased. Thus, an additional cooling device for cooling the air inside the power panel is needed. For example, a heat exchanger or the like for discharging heat inside the power panel to the outside of the power panel is needed.

On the other hand, with reference to FIG. 1 to FIG. 5, in the first motor drive device 1 of the present embodiment, while the printed circuit board 21 is arranged inside the housing of the power panel, the heat-generating components are cooled by incorporating the outside air into the duct 41. The heat-generating components can be cooled by the outside air, and thus, the cooling performance is excellent. In addition, the motor drive device of the present embodiment releases the air whose temperature has been increased to the outside of the power panel, and thus, can suppress an increase in the temperature of the air inside the power panel.

The power elements are in contact with the heat-sink unit of the cooling device in the motor drive device according to the present embodiment, but the configuration is not limited to this, and the heat-generating components may be away from the heat-sink unit. Also in this case, the air inside the power panel can be cooled by the main body part of the duct. The heat-generating components can be cooled by the air inside the power panel.

Figure 8:
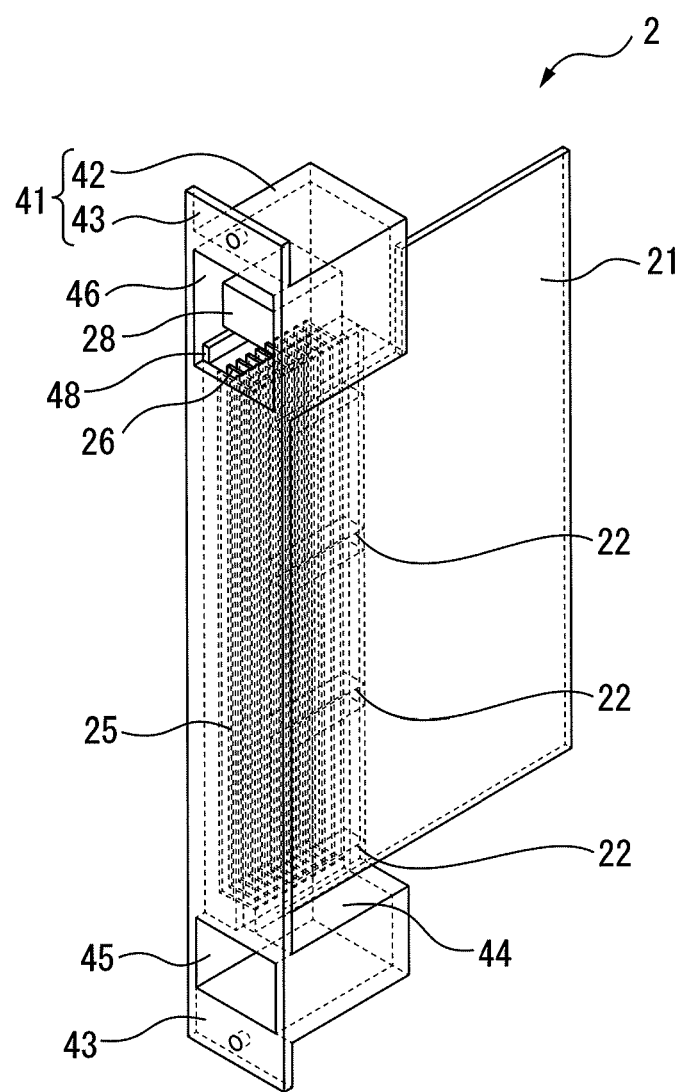
FIG. 8 is a perspective view of second motor drive device in the embodiment.
Figure 9:
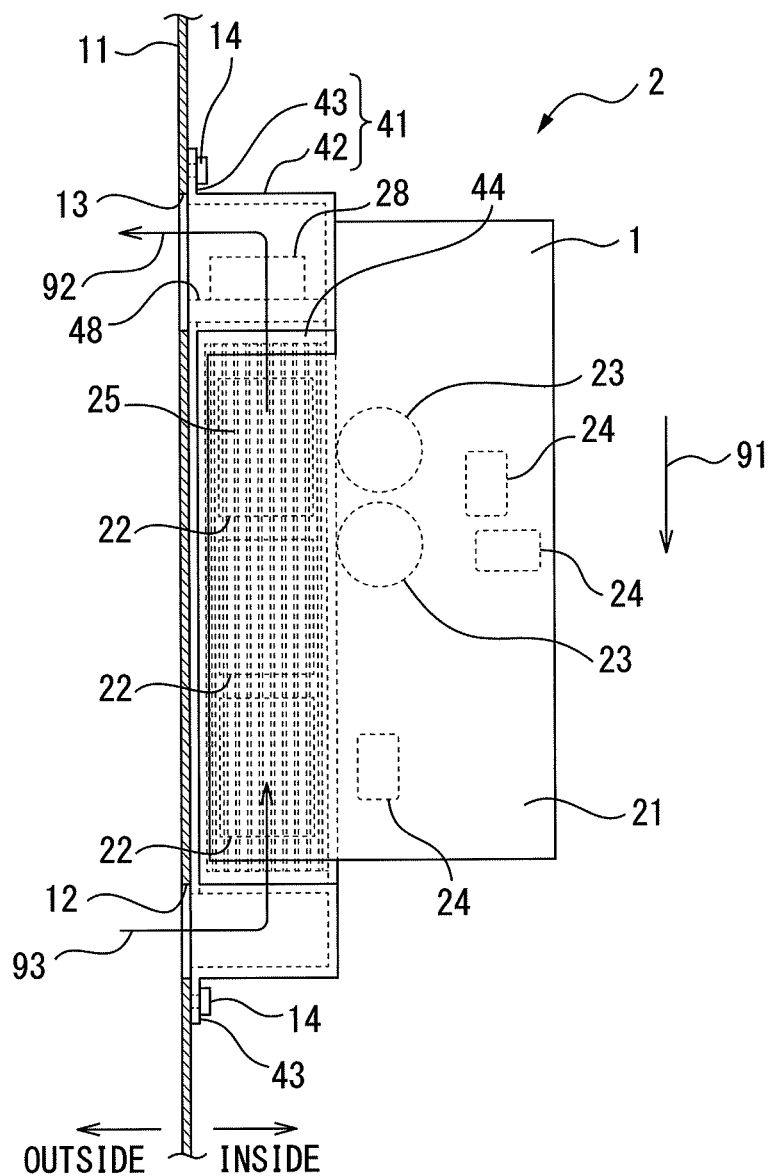
FIG. 9 is a schematic partial cross-sectional view when the second motor drive device in the embodiment is attached to the power panel.

FIG. 8 shows a schematic perspective view of second motor drive device in the present embodiment. FIG. 9 shows a schematic partial cross-sectional view when the second motor drive device is attached to the housing of the power panel. With reference to FIG. 8 and FIG. 9, the heat-sink unit 25 of second motor drive device 2 includes fins 26 arranged inside the main body part 42 of the duct 41. The fins 26 are fixed to the main body part 42. The fins 26 are formed to have a plate shape. The plurality of fins 26 is arranged so as to be spaced-apart from one another. The plurality of fins 26 is formed so as to extend along an air-flowing direction.

Since the heat-sink unit 25 of the second motor drive device 2 includes the plurality of fins 26, heat exchange between the heat-sink unit and air can be promoted. The heat-sink unit 25 can be effectively cooled by air flowing through the duct 41. Accordingly, the heat-generating components can be effectively cooled.

In addition, the second motor drive device 2 in the present embodiment comprises a cooling fan 28 which generates an air flow inside the duct 41. The cooling fan 28 of the second motor drive device 2 is arranged inside the duct 41. The cooling fan 28 is arranged in the vicinity of the outflow port 46. The cooling fan 28 is supported by a supporting part 48 which is formed inside the main body part 42. The cooling fan 28 is fixed to the supporting part 48 by use of a fastening member such as a screw.

The cooling fan 28 is driven so that air inside the duct 41 is forcibly made to flow out from the outflow port 46 as indicated by the arrow 92. Outside air flows in through the inflow port 45. Since the motor drive device comprises the cooling fan 28, an air flow can be forcibly generated inside the duct 41. Accordingly, the heat-sink unit 25 can be effectively cooled.

In addition, when the motor drive device comprises the cooling fan 28, the orientation of the motor drive device can be arbitrarily set. In the example illustrated in FIG. 9, the extending direction of the duct 41 is parallel to the vertical direction indicated by the arrow 91. However, the second motor drive device 2 can be attached in an arbitrary orientation. For example, the second motor drive device 2 may be fixed to the wall part 11 so that the extending direction of the duct 41 is parallel to the horizontal direction. In order to promote the air flow using the action of air convection, it is preferable that the outflow port 46 is arranged at the upper side of the inflow port 45.

Figure 10:
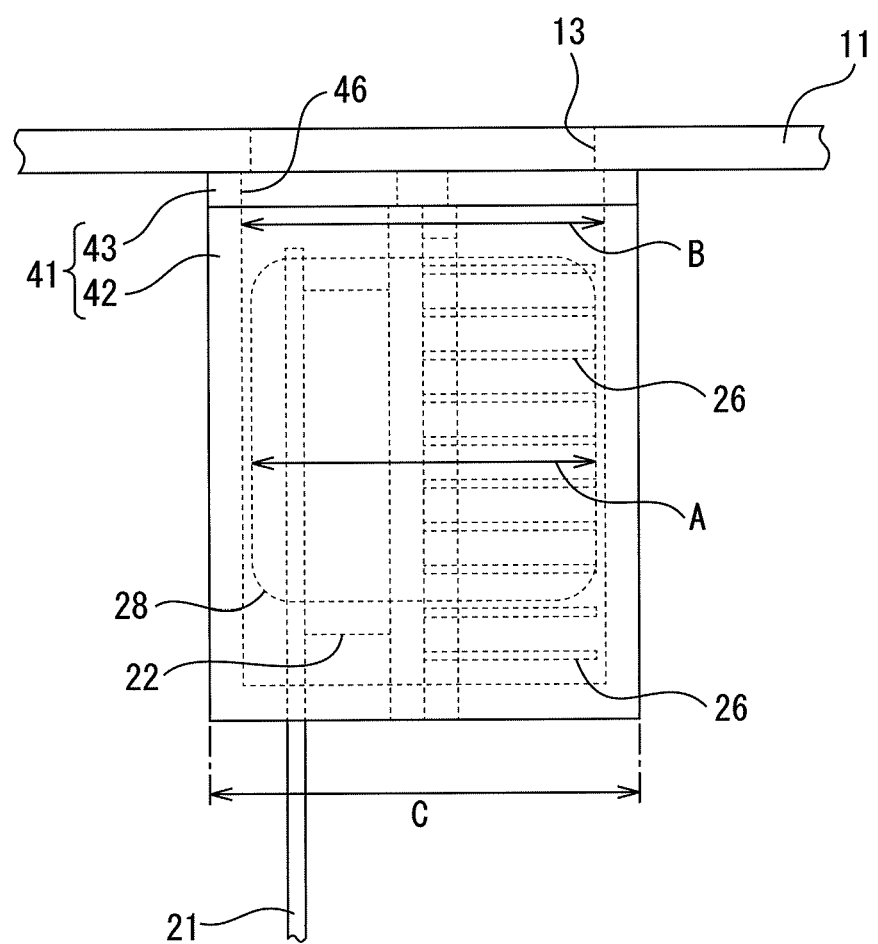
FIG. 10 is a schematic view when the second motor drive device in the embodiment is viewed in a plane.

FIG. 10 shows a plan view of the second motor drive device in the present embodiment. The cooling fan 28 is housed inside the main body part 42 of the duct 41. The width A of the cooling fan 28 may be smaller than the width B of the hollow inside the main body part 42. The width A of the cooling fan 28 is not affected by the size of the opening 13 of the wall part 11. Thus, the width A of the cooling fan 28 can be made larger. In other words, the large cooling fan 28 can be arranged.

Figure 11:
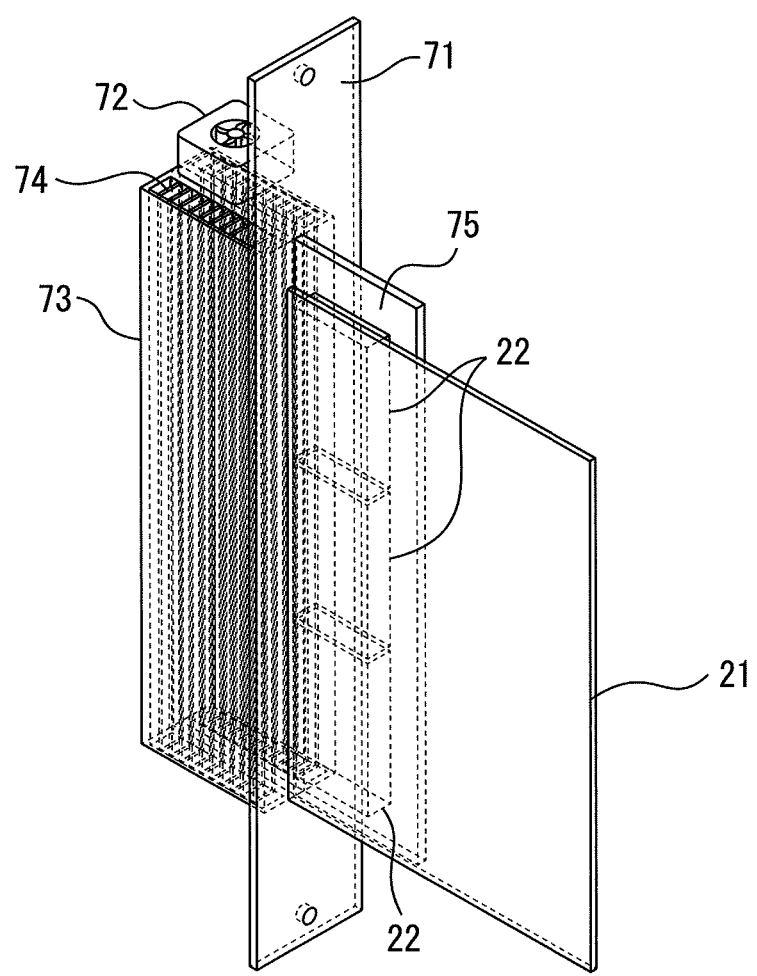
FIG. 11 is a perspective view of a motor drive device of second comparative example.
Figure 12:
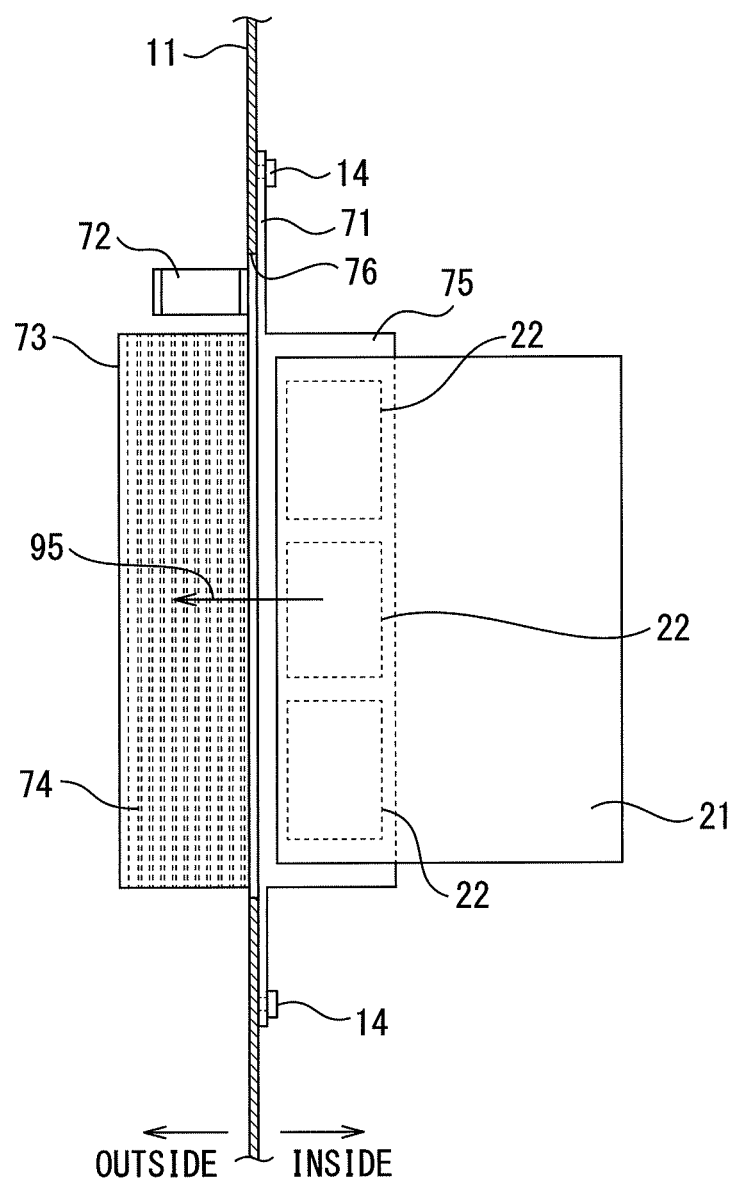
FIG. 12 is a schematic partial cross-sectional view when the motor drive device of the second comparative example is attached to the power panel.

FIG. 11 shows a schematic perspective view of a motor drive device of second comparative example. FIG. 12 shows a schematic partial cross-sectional view of the motor drive device of the second comparative example. With reference to FIG. 11 and FIG. 12, the motor drive device of the second comparative example comprises the duct 73 which is fixed to the plate-like member 71 and the cooling fan 72. A heat-transfer plate 75 is fixed to the plate-like member 71. The power elements 22 arranged on the printed circuit board 21 are in contact with the heat-transfer plate 75. The heat-transfer plate 75 is thermally connected to the duct 73. The fin 74 is formed inside the duct 73. The heat-sink unit includes the duct 73, the fin 74, and the heat-transfer plate 75.

In the motor drive device of the second comparative example, while the printed circuit board 21 is arranged inside the housing of the power panel, the duct 73, the fin 74, and the cooling fan 72 are arranged outside the housing.

Figure 13:
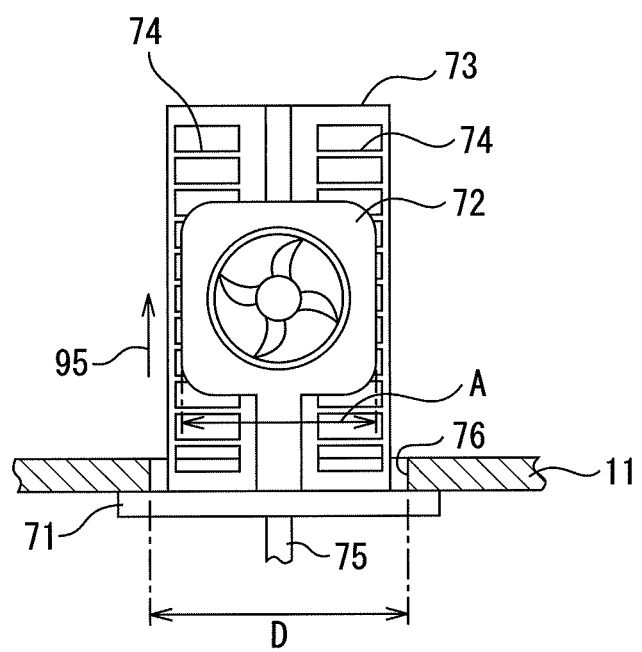
FIG. 13 is a schematic partial cross-sectional view when the motor drive device of the second comparative example is viewed in a plane.

FIG. 13 shows a schematic partial cross-sectional view of the motor drive device of the second comparative example when viewed from above. With reference to FIG. 11 to FIG. 13, an opening 76 is formed in the wall part 11 of the housing. The opening 76 is formed so that the duct 73 and the cooling fan 72 pass therethrough. In addition, the opening 76 is formed to be small so that the plate-like member 71 does not pass therethrough. When the motor drive device of the second comparative example is attached to the wall part 11, the duct 73 and the cooling fan 72 are inserted into the opening 76 of the wall part 11 from the inside of the housing as indicated by the arrow 95. The plate-like member 71 is fixed to the wall part 11 by use of the screw 14.

As just described, in the motor drive device of the second comparative example, the duct 73 and the cooling fan 72 need to pass through the opening 76 of the wall part 11 in order to fix the motor drive device to the housing of the power panel. Thus, the width A of the cooling fan 72 needs to be smaller than the width D of the opening 76. In other words, the cooling fan 72 is limited by the width D of the opening 76, and a small one needs to be selected.

On the other hand, with reference to FIG. 10, in the second motor drive device of the present embodiment, the width A of the cooling fan 28 can be set without being limited by the opening 13. For example, the width A of the cooling fan 28 can be made large to the width obtained by subtracting the plate thickness from the outside width C of the main body part 42 of the duct 41. Alternatively, the width A of the cooling fan 28 can be made larger than the width of the opening 13. Thus, a cooling fan larger than the cooling fan 72 of the motor drive device of the second comparative example can be used. The second motor drive device 2 can increase the flow rate of the air flowing through the duct 41, and improves the cooling performance thereof more than that of the motor drive device of the second comparative example.

Figure 14:
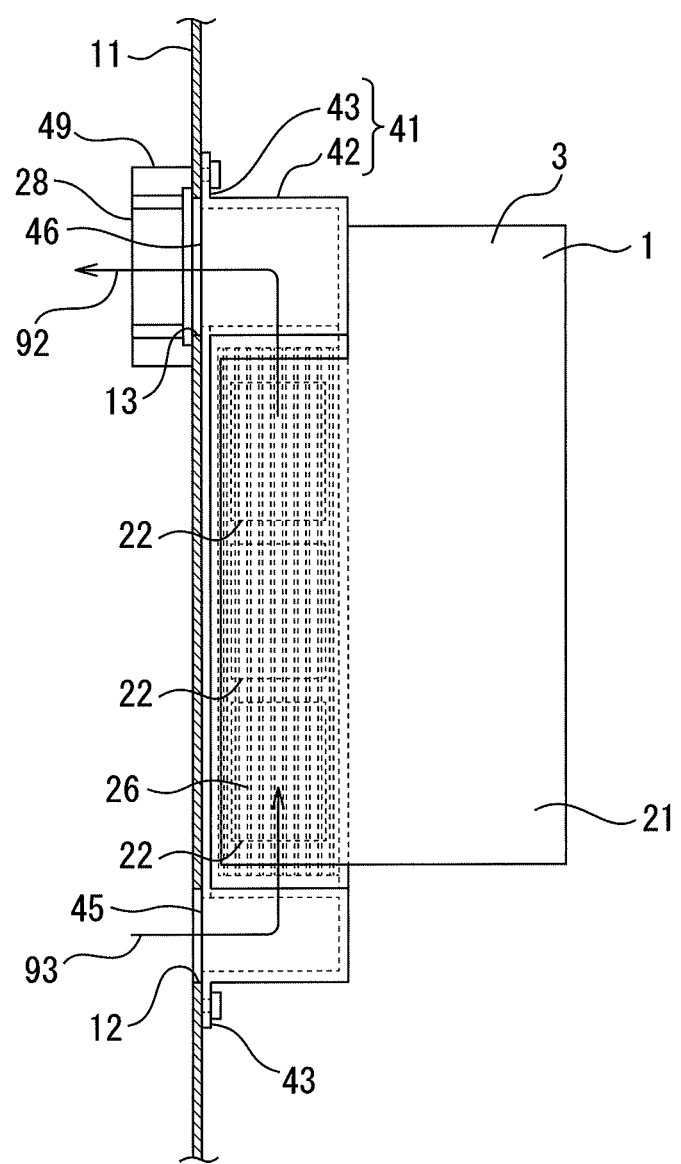
FIG. 14 is a schematic partial cross-sectional view when third motor drive device in the embodiment is attached to the power panel.

FIG. 14 shows a schematic partial cross-sectional view of third motor drive device in the present embodiment. The third motor drive device 3 differs from the second motor drive device 2 in the position of the cooling fan 28. In the third motor drive device 3, the cooling fan 28 is arranged outside the duct 41. The cooling fan 28 is fixed to the wall part 11 of the housing through a supporting part 49. The cooling fan 28 may be supported by the main body part 42 of the duct 41.

The cooling fan 28 is arranged so as to be opposed to the outflow port 46 of the duct 41. When the cooling fan 28 is arranged in the vicinity of the outflow port 46 of the duct 41, the cooling fan 28 can promote the air flow inside the duct 41. The cooling fan 28 is driven so that outside air flows into the duct 41 as indicated by the arrow 93. In addition, the air after undergoing heat exchange is released to the atmosphere as indicated by the arrow 92.

In the second motor drive device 2 of the present embodiment, the cooling fan 28 is arranged inside the duct 41. In addition, in the third motor drive device 3, the cooling fan 28 is arranged at a position opposed to the outflow port 46 of the duct 41. The cooling fan is not limited to these modes, and can be arranged at any position which generates an air flow inside the duct. For example, the cooling fan may be arranged at a position opposed to the inflow port of the duct.

Figure 15:
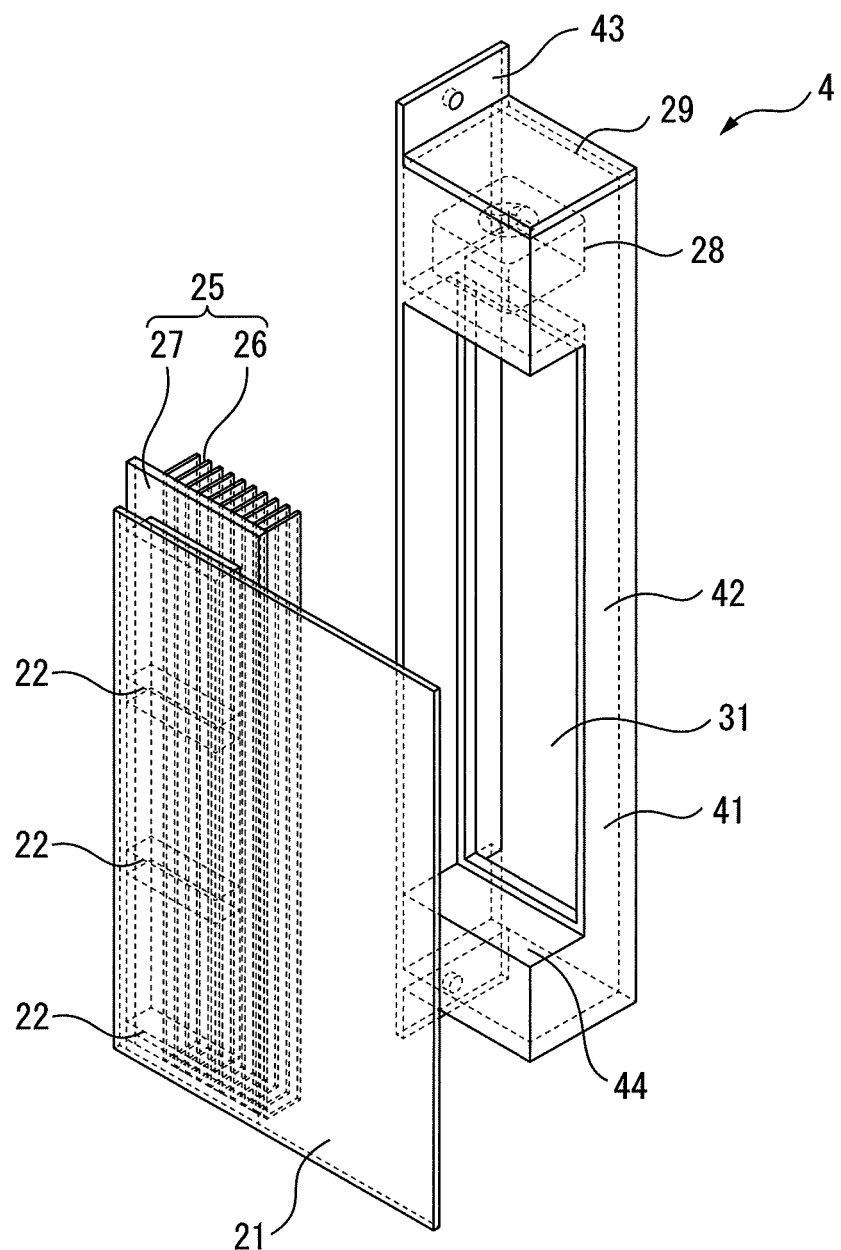
FIG. 15 is first schematic exploded perspective view of fourth motor drive device in the embodiment.
Figure 16:
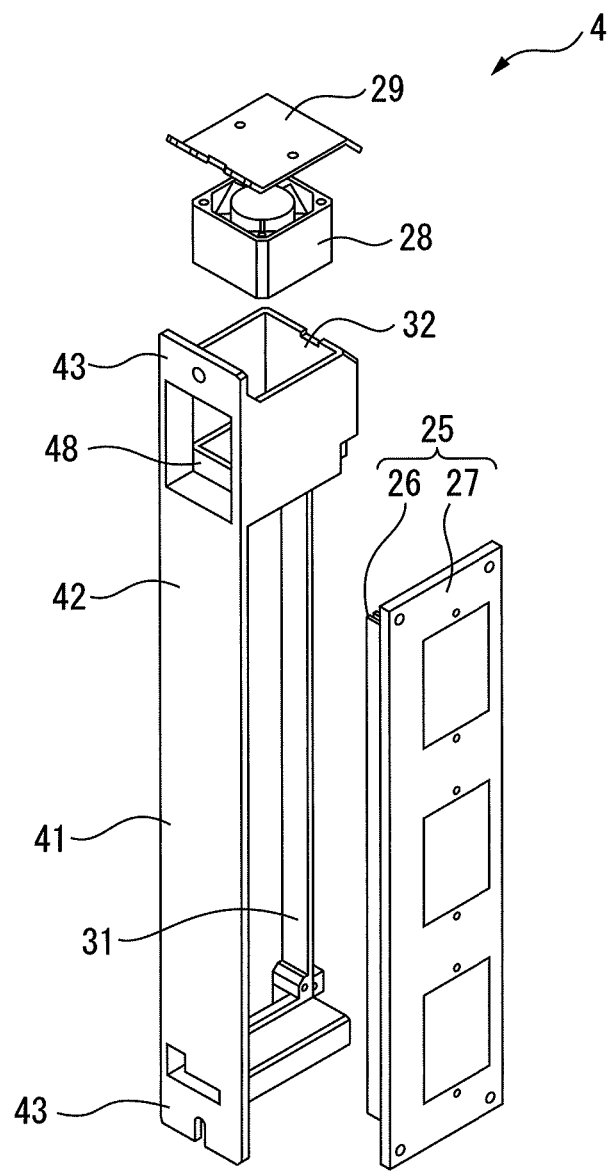
FIG. 16 is second exploded perspective view of the fourth motor drive device in the embodiment.

FIG. 15 shows first schematic exploded perspective view of fourth motor drive device in the present embodiment. FIG. 16 shows second exploded perspective view of the fourth motor drive device in the present embodiment. In fourth motor drive device 4, a part of the duct 41 is formed in a detachable manner.

With reference to FIG. 15 and FIG. 16, the heat-sink unit 25 of the fourth motor drive device 4 includes the plurality of fins 26 and a plate-like member 27 which supports the fins 26. An opening 31 is formed in the main body part 42 of the duct 41. The plate-like member 27 is formed so as to cover the opening 31. The power elements 22 are in contact with the plate-like member 27. The plate-like member 27 configures a part of the duct 41. The plate-like member 27 is formed so as to be fixed to a part around the opening 31 by use of a fastening member such as a screw.

The fourth motor drive device 4 is formed so that the plate-like member 27, the fins 26, and the printed circuit board 21 can be integrally detached from the main body part 42 by removing the screw. By adopting this configuration, a degree of freedom of the structure of the duct 41 is increased, and designing becomes easy. In particular, the configuration of the heat-sink unit 25 or the duct 41 can be easily changed corresponding to the type or the performance required for the heat-sink unit 25. For example, the number, the size, or the like of the fins can be changed corresponding to the heat-generating capacity of the heat-generating components.

In addition, the duct 41 of the fourth motor drive device 4 includes a plate-like part 29 which can be detached from the main body part 42. The plate-like part 29 is arranged around the cooling fan 28. In the present embodiment, the detachable plate-like part 29 is arranged at the upper side of the cooling fan 28. The plate-like part 29 is a part which configures an end surface of the main body part 42. The plate-like part 29 is fixed to the main body part 42 of the duct 41 by use of a fastening member such as a screw. The plate-like part 29 can be detached from the main body part 42 by removing the screw.

The duct 41 is formed so that the cooling fan 28 arranged inside the duct 41 can be taken out by detaching the plate-like part 29. By adopting this configuration, the plate-like part 29 is detached and an inspection of the cooling fan 28 can be performed. Alternatively, when the cooling fan 28 breaks down, the plate-like part 29 is detached and the cooling fan 28 can be replaced. As just described, a worker can perform maintenance or replacement of the cooling fan 28 without detaching the whole of the motor drive device from the housing. Maintenance or replacement of the cooling fan 28 becomes easy by providing the detachable plate-like part 29.

According to the present invention, a motor drive device which can be cooled by outside air and excels in cooling performance can be provided.

The above-described embodiments can be appropriately combined. In the respective drawings described above, the same or equivalent parts are denoted by the same reference signs. The above-described embodiments are examples, and do not limit the invention. In addition, in the embodiments, changes of the embodiments defined by claims are included.

The invention claimed is:

1. A motor drive device fixed to a wall part of a housing of a power panel, the motor drive device comprising:
   a duct arranged inside the housing and fluidly isolated therefrom, the duct including a main body part having:
      an inflow port,
      an outflow port,
      a flow passage for outside air defined between the inflow port and the outflow port,
      the inflow port being arranged to draw the outside air through the inflow port via openings in the wall part of the housing and direct the outside air toward the flow passage,
      the outside air flowing out of the outflow port to a location exterior to the housing of the power panel,
      the inflow port, the outflow port and the flow passage are each fluidly isolated from the housing, and
   a concave part arranged laterally on the main body part,
   a heat-sink unit coupled to the main body part so as to release heat into the duct;

a printed circuit board including a second surface on which one or more heat generation components are arranged, the second surface extending in a direction parallel to the wall part, the one or more heat generation components generating heat, the one or more heat generation components each having a third surface opposite to the second surface, the third surface contacting at least a portion of the main body part, such that the flow passage defined within the main body part is indirectly coupled to the third surface so as to remove heat from the one or more heat generation components; wherein the one or more heat generation components being arranged along a first line parallel to the wall part, a width of the one or more heat generation components not extending beyond the concave part in a direction perpendicular to the first line.

2. The motor drive device according to claim 1, further comprising a cooling fan generating an air flow of outside air inside the duct.

3. The motor drive device according to claim 2, wherein the cooling fan is arranged inside the duct.

4. The motor drive device according to claim 1, wherein the heat-sink unit includes a plurality of fins, and
each fin of the plurality of fins is arranged inside the duct.

5. The motor drive device according to claim 1, wherein the heat-sink unit includes a plate-like member supporting each fin of the plurality of fins, and
the plate-like member is detachable from the main body part of the duct.

6. The motor drive device according to claim 3, wherein the duct includes a plate-like part which can be detached from the main body part, and the plate-like part is arranged around the cooling fan and is formed so that the cooling fan can be taken out from the inside of the duct by being detached from the main body part.

* * * * *